United States Patent
Ghera et al.

(10) Patent No.: US 7,116,471 B2
(45) Date of Patent: Oct. 3, 2006

(54) METHOD AND SYSTEM FOR IMPROVED EYE PROTECTION SAFETY OF DISTRIBUTED RAMAN AMPLIFIERS

(75) Inventors: Uri Ghera, Tel-Aviv (IL); Daniel Berger, Petach-Tikva (IL); Itzhak Filiba, Petach-Tikva (IL); David Menashe, Even-Yehuda (IL)

(73) Assignee: Redc Optical Networking Ltd., Tel Aviv (IL)

( * ) Notice: Subject to any disclaimer, the term of this patent is extended or adjusted under 35 U.S.C. 154(b) by 0 days.

(21) Appl. No.: 11/001,055

(22) Filed: Dec. 2, 2004

(65) Prior Publication Data

US 2006/0119931 A1 Jun. 8, 2006

(51) Int. Cl.
*H01S 4/00* (2006.01)
*H04B 10/12* (2006.01)

(52) U.S. Cl. .................................................. 359/334
(58) Field of Classification Search ................. 359/334
See application file for complete search history.

(56) References Cited

U.S. PATENT DOCUMENTS

| | | | |
|---|---|---|---|
| 5,136,410 | A | 8/1992 | Heiling et al. |
| 5,428,471 | A | 6/1995 | McDermott |
| 6,373,621 | B1 | 4/2002 | Large et al. |
| 6,423,963 | B1 | 7/2002 | Wu |
| 6,433,922 | B1 * | 8/2002 | Ghera et al. ............ 359/334 |
| 6,441,951 | B1 * | 8/2002 | Tanaka et al. ........... 359/334 |
| 6,519,082 | B1 * | 2/2003 | Ghera et al. ........... 359/341.4 |
| 6,621,620 | B1 | 9/2003 | Ohtani |
| 6,631,025 | B1 | 10/2003 | Islam et al. |
| 6,683,712 | B1 | 1/2004 | Tanaka et al. |
| 6,807,001 | B1 | 10/2004 | Ranka et al. |
| 7,031,049 | B1 * | 4/2006 | Kamada et al. .......... 359/334 |
| 2004/0090663 | A1 | 5/2004 | Kamada et al. |
| 2004/0201882 | A1 | 10/2004 | Kikuchi et al. |
| 2005/0024712 | A1 * | 2/2005 | Hiraizumi et al. ........ 359/334 |
| 2005/0213196 | A1 * | 9/2005 | Ishikawa et al. .......... 359/334 |

FOREIGN PATENT DOCUMENTS

WO    WO 2004105275 A1 * 12/2004

OTHER PUBLICATIONS

"Non-linear fiber optics" by G.P. Agrawal pp. 316-369 Academic Press, 2nd edition, 1995.
International standard IEC 60825-2 Safety of laser products—part 2; "Safety of optical fibre communication systems".
J. Auyeung et al "Spontaneous and Stimulated Raman Scattering in Long Low Loss Fibers" Journal of Quantum Electronics, vol. QE-15, No. 5 p. 347 1978.

* cited by examiner

*Primary Examiner*—Mark Hellner
*Assistant Examiner*—Eric Bolda
(74) *Attorney, Agent, or Firm*—Mark M. Friedman

(57) ABSTRACT

A system and method for providing eye-safety protection during operation of distributed Raman amplifiers based on the application of continuous out-of-band amplified spontaneous scattering (ASS) monitoring in an optical communication network span coupled to the Raman amplifier, and real-time detection and analysis of changes in the monitored ASS power level, The system includes at least one Raman pump for introducing Raman energy into the span, a monitoring unit for performing the continuous ASS monitoring, and a control unit operative to detect and analyze in real-time changes in the ASS power, and upon determination that such changes indicate an open span, to reduce the level of the Raman pump energy entering the span to a safe level.

6 Claims, 11 Drawing Sheets

METHOD AND SYSTEM FOR IMPROVED EYE PROTECTION SAFETY OF DISTRIBUTED RAMAN AMPLIFIERS

FIELD OF THE INVENTION

The present invention relates generally to optical fiber amplifiers used in fiber optics telecommunications systems. More particularly, the invention relates to Raman optical fiber amplifiers, and to methods and apparatuses for detecting and diagnosing faults in an optical communication system span that utilizes such amplifiers, in order to provide improved eye protection safety.

BACKGROUND OF THE INVENTION

Modern optical communication systems utilize optical amplifiers to amplify wavelength division multiplexed (WDM) signal channels as they are transmitted through the system. The first optical amplifiers to be commercially deployed were Erbium doped fiber amplifiers (EDFAs), which are self-contained units placed between 60–120 km length spans of the communication link. These units contain a special Erbium doped fiber (EDF), which serves as the gain medium used to transfer energy from laser diode pumps within the units to the optical signal channels as they pass through the unit.

Recently, a new type of amplifier, namely a distributed Raman amplifier (DRA), has been introduced into optical communication systems. A significant difference between EDFAs and DRAs is that in the latter the transmission fiber itself serves as the gain medium, meaning that the signal channels are amplified as they travel through the transmission fiber. Thus, the amplification process is distributed along the transmission fiber, as opposed to being lumped in a self-contained unit as in the case of the EDFA. This allows the distance between EDFAs to be increased beyond 120 km, and/or the optical signal to noise ratio (OSNR) of the system to be improved, thus allowing higher bandwidth communication.

Distributed Raman amplifiers and their applications to optical communication systems are well known in the art, see for example, U.S. Pat. Nos. 6,519,082 and 6,631,025 and references therein. FIG. 1 shows a schematic representation of a span of an optical communication system employing distributed Raman amplifiers. These amplifiers comprise high power laser pumps 102 coupled to the amplified span in either forward configuration or backward configuration. In forward configuration the laser pump is coupled to an input 106 of a transmission fiber 108, with a pump energy 104 co-propagating with an optical signal 110. In backward configuration the laser pump is coupled to an output 112 of the transmission fiber, with a pump energy 114 counter-propagating to optical signal 110. While the shown span employs both forward and backward Raman amplifiers together, in many cases only one of the two types are employed. If the shown span is the first in the system, then it is directly preceded by an optical signal transmitter; otherwise it is preceded by an EDFA (or another type of lumped amplifier) used to amplify the signal channels from the preceding span. If the shown span is the last in the system, then it is directly followed by an optical signal receiver; otherwise it is followed by another EDFA (or another type of lumped amplifier) used to amplify the signal channels before they enter the next span.

As the pump power propagates along the transmission fiber (either in forward or backward configuration), power is transferred to the optical signal channels, thus causing them to be amplified during their propagation along the fiber. The transfer of energy occurs due to the non-linear stimulated Raman scattering effect, as described for example in "Non-linear fiber optics", by G. P. Agrawal, pp. 316–369, Academic Press, $2^{nd}$ Edition, 1995. In order for the energy transfer to be effective, the optical frequency of the pump lasers should be about 13 THz higher than that of the optical signal channels. Thus, if for example the optical signal channels occupy the communication band known as the C band (1525–1565 nm), the wavelength of the pump lasers should be in the range of 1420 nm–1480 nm. The term communication band is used to refer to the wavelength band containing the WDM signal channels transmitted by the system. The other commonly used communications band is the L band (about 1570–1610 nm). Other communication bands may be used in the future, and a single system may contain multiple communication bands. Multiple pumps with different wavelengths may be utilized to achieve uniform amplification over the entire communication band, or even over multiple bands. Furthermore, since Raman scattering is a non-linear effect, the pump power input into the transmission fiber needs to be particularly high, typically 0.2–1 W, in order for signal amplification to occur.

Thus, in contrast with EDFAs and other types of lumped amplifiers where the amplifier pump power remain contained within a closed unit, the high Raman pump power propagates along the transmission fiber, posing a potential safety hazard to persons coming into contact with the system. Particularly, if the pump is operated while a connector along the span is open, or when there is a break or cut in the transmission fiber, the pump energy may escape and cause harm to human eyes, as well as material damage to the system. As used herein, the term "open span" refers to the state where there is an open connector or fiber break or cut within the span employing the Raman amplifier, or any other situation that could cause significant leakage of pump power from the span, thus posing danger to human eyes coming in contact with the leaked power. The term "opening" is used to refer to the point along the span where the leakage of power occurs. Therefore, there is a need to immediately detect any such open span, and shut down the Raman pumps within a time span short enough to avoid harm to human eyes (henceforth referred to as "eye-safe time"). Exemplarily, International Standard IEC 60825-2, "Safety of Laser Products—Part 2: Safety of optical fiber communication systems", may be viewed for a discussion of various aspects related to safety of laser products within fiber optic communication systems.

The automatic shutdown mechanism should on the one hand be as fail safe as possible, and on the other hand not be activated mistakenly by events that do not pose potential safety hazards. Another desired feature is that the shutdown mechanism should be an integrated feature of the Raman amplifier, to further enhance safety and to avoid dependence on other parts of the communication system. Finally, the detection system should ideally provide as much information as possible to the system management with regard to the type of failure (e.g. fiber break or open connector), and its position along the span. This facilitates rapid correction of the failure, and minimization of system downtime.

These requirements have been partly recognized in the prior art, and a number of methods and systems have been disclosed to address the problem. For example, U.S. Pat. Nos. 5,136,410 and 5,428,471 disclose monitoring the presence of optical communication signal channels in the communication band to detect an open span. However, Raman amplification can complicate such monitoring due to significant levels of amplified spontaneous scattering (ASS) generated within the communication band by the pump energy (see for example J. Auyeung et al, "Spontaneous and Stimulated Raman scattering in long low loss fibers", Journal of Quantum Electronics, Vol. QE-15 No. 5, P. 347, 1978). Since ASS is generated at any point where pump energy is present at a high enough level, and can propagate in both directions, it can mask the presence or absence of signal channels even when the span is open. For the purpose of this invention, ASS is divided into "in-band ASS" and "out-of-band ASS". In-band ASS is defined to mean amplified spontaneous scattering with the communication band (or bands) used in the system. Out-of-band ASS is defined to mean amplified spontaneous scattering in a selected wavelength band that is outside the communication band (or bands) used in the system. For example, in a system using the C-band as the communication band, the selected wavelength band for out-of-band ASS may be the so-called "short band", defined as the wavelength region 1500–1520 nm.

U.S. Pat. No. 6,683,712 addresses the issue of ASS in the communication band by providing a mechanism for monitoring the output pump energy of the Raman amplifier, and using the monitored value to estimate the ASS level. This is then used as an input to the signal detection circuit to subtract the ASS level. U.S. Pat. No. 6,373,621 discloses the use of a periodic filter to allow selective detection of the signal channels within the communication band, while blocking the ASS between the channels.

However, even if the issue of ASS in the communication band is overcome, modern communication links support Add and Drop of signal channels, which can lead to drastic changes in the signal level even if the span is still functional. In an extreme situation there may be no signal due to all channels being dropped, but the span is not open (i.e. it is still functional). This is an inherent problem with using signal channel detection as a safety mechanism.

This last problem has been addressed in U.S. Pat. No. 6,423,963, which discloses monitoring of a supervisory channel (existing in many commercial communication systems) in addition to monitoring of the signal channels. The advantage of monitoring a supervisory channel is that it should always be present during normal system operation, even if all signal channels are dropped. The disadvantage of using the supervisory channel is that it is not present in all systems, and in any case it involves relying on a feature of the system external to the Raman amplifier. However, the combined monitoring of the signal channels and the supervisory channel provides additional safety and prevents accidental shutdown when some or all of the signal channels are dropped. Another mechanism disclosed in this patent is related to the monitoring of pump energy back-reflection, which can be used to detect certain types of open connectors, but not fiber break. For example, opening a PC type connector within a certain distance of the Raman amplifier will cause a detectable increase in pump energy back-reflection. The advantage of this latter mechanism is that it is independent of system features such as the use of a supervisory channel. A main disadvantage is that it is not sensitive to certain types of open spans (e.g. fiber breaks or open APC connectors).

U.S. Pat. No. 6,807,001 also discloses the monitoring of Raman pump back-reflection to detect an open connector, in combination with monitoring of the signal channels. This invention suffers from the same disadvantages discussed above.

U.S. Pat. No. 6,519,082, assigned to the present assignee, extends the use of Raman pump back-reflection monitoring to include an analysis of the time-dependent behavior of the pump back-reflection. Such an analysis could potentially provide additional information as to the type of event triggering the change in back-reflection, and possibly allow detection of additional types of open spans. However, it would still not allow detection of all types of fiber breaks, and the time required to perform the analysis could be prohibitively long in the context of eye-safety requirements.

Another method to detect an open span is disclosed in U.S. Pat. No. 6,373,621 and U.S. patent application Ser. No. 2004/0201882. In this method the Raman pump energy itself is modulated, and this modulation signal is detected at the other end of the span, with a disappearance of the modulation signal signifying an open span. If there are both forward and backward Raman amplifiers on the span, then the pump energy from both pumps can be modulated, and each amplifier will detect the modulation signal of the other. Thus, an open span will cause both Raman amplifiers to shutdown. If, as is often the case, there is only a single Raman amplifier, then it is necessary to rely on the system to send a shut down signal to the amplifier once the loss of the modulation signal has been detected at the other end of the span. In either case it is clear that the shut down mechanism is not integral to the individual Raman amplifier, and relies on other aspects of the systems.

U.S. patent application Ser. No. 2004/0090663 discloses the use of ASS outside the communication band to detect the existence of a point of high loss along the span during start-up of the amplifier pumps. As the pump power is increased during start-up, it is monitored, and when it reaches a predetermined level, a loss point is detected based on the ASS power level at the predetermined level of pump power. This invention relates only to the detection of a loss point present before start-up of the amplifier. It does not relate to continuous, dynamic monitoring of the ASS to detect in real-time an open span that occurs during operation of the amplifier. Furthermore, the invention involves monitoring of the pump power together with the ASS power, and the detection of a loss point based on a combination of both monitored powers.

Thus, there is a need for an additional protection mechanism, which does not suffer from the shortcomings described above. Specifically, the mechanism should be self-contained within the Raman amplification system, and not be dependent on other features of the communication system of which the amplifier is part. Furthermore, it should be sensitive to all types of open spans, in contrast to pump energy back reflection, which is sensitive only to certain types of open connectors. A mechanism that satisfies these criteria should be based solely on the real-time detection of changes in the power level of out-of-band ASS, which is created along the transmission fiber and which propagates opposite to the direction of the pump energy (i.e. towards the amplifier). If an open span occurs within a certain distance of the Raman amplifier, then the power level of ASS reaching the amplifier will decrease, allowing the detection of the open span. Thus, such a mechanism facilitates continuous, real-time detection of an open span that occurs during operation of the amplifier.

SUMMARY OF THE INVENTION

The present invention discloses a system and method for providing eye-safety protection during operation of distributed Raman amplifiers based on the application of continuous out-of-band ASS monitoring, and real-time detection and analysis of changes in the monitored ASS power level. The system and method disclosed herein can detect an open span in real-time as well as provide diagnostic information with respect to the position of the opening. The system and method can also be used to assist in identifying span degradation, which could potentially develop into an open span, thus allowing preemptive corrective action to be taken.

In a preferred embodiment of the distributed Raman amplification system of the present invention, the system comprises a pump unit for introducing Raman pump energy of at least one wavelength into the span; a monitoring unit for continuously monitoring the power level of out-of-band ASS entering the amplification system from the span; and a control unit operative to reduce the level of Raman pump energy entering the span to a safe level, in response to determination of an open span based solely on real-time detection of a change in the out-of-band ASS power level.

Preferably, the control unit includes a detection and analysis function to detect and analyze in real-time change in the out-of-band ASS power level; an open span determining function to determine whether the change in the out-of-band ASS power level indicates an open span, and a safety function activated when an open span is determined, to effect a reduction of the Raman pump energy entering the span.

Preferably, the safety function involves a complete shutdown of the pump unit. Preferably, the control unit is operative such that the time elapsed between the occurrence of the open span and the activation of the safety function is shorter than an eye-safe time.

Preferably, the control unit further includes an open span characteristics determining function for determining, based on the magnitude of change in the ASS power level, the approximate position of the opening once an open span has occurred. Preferably, the control unit further includes a span degradation function for detecting degradation in the span before the degradation develops into an open span.

In another embodiment of the distributed Raman amplification system of the present invention, the system comprises a pump unit for introducing Raman pump energy into the span; a monitoring unit for continuously monitoring the power level of out-of-band ASS entering the amplification system from the span; a pump energy back-reflection monitoring unit for continuously monitoring the level of pump energy back-reflected from the span into the amplification system; and a control unit that includes a detection and analysis function to detect and analyze in real time changes in all monitored power levels, a determining function to determine an open span based on said changes in all monitored power levels, and a safety function activated when an open span is determined, to effect a reduction of the Raman pump energy entering the span.

Preferably, the control unit further includes an open span characteristics determining function for determining, based on changes in all monitored power levels, the position and type of opening (open connector or fiber break), once an open span has occurred.

In yet another embodiment of the distributed Raman amplification system, working in backward configuration, the system comprises a pump unit for introducing Raman pump energy into the span; a monitoring unit for continuously monitoring the power level of out-of-band ASS entering the amplification system from the span; a pump energy back-reflection monitoring unit for continuously monitoring the level of pump energy back-reflected from the span into the amplification system; a modulation signal monitoring unit for continuously monitoring a modulation signal imposed on a system supervisory channel entering the amplification system from the span, a communication band power monitoring unit for continuously monitoring the power within the communication band entering the amplification system from the span; and a control unit that includes a detection and analysis function to detect and analyze in real time changes in all monitored power levels, a determining function to determine an open span based on said changes in all monitored power levels, and a safety function activated when an open span is determined, to effect a reduction of the Raman pump energy entering the span.

In yet another embodiment of the distributed Raman amplification system, working in forward configuration, the system comprises a pump unit for introducing Raman pump energy into the span; a monitoring unit for continuously monitoring the power level of out-of-band ASS entering the amplification system from the span; a pump energy back-reflection monitoring unit for continuously monitoring the level of pump energy back-reflected from the span into the amplification system; a communication band power monitoring unit for continuously monitoring the power within the communication band entering the amplification system from the span, a preceding span communication band monitoring unit for continuously monitoring the power level within the communication band entering the amplification system from the preceding span; and a control unit that includes a detection and analysis function to detect and analyze in real time changes in all monitored power levels, a determining function to determine an open span based on said changes in all monitored power levels, and a safety function activated when an open span is determined, to effect a reduction of the Raman pump energy entering the span.

In a preferred embodiment of the method of the present invention, the method comprises the steps of continuously monitoring an out-of-band ASS power level; detecting when changes in the ASS power level signify an open span; and, responsive to the detection result, reducing the level of Raman pump energy entering the span to a safe level. Preferably, the step of reducing the level of Raman pump energy entering the span involves activation of a complete shutdown of the Raman pump unit. Preferably, the detection and reduction of pump energy are fast enough so that the time between the opening of the span and the activation of the safety mechanism is shorter than the eye-safe time. Preferably, the method further includes the step of determining, based on the magnitude of change in the ASS power level, the approximate position of the opening once an open span has occurred. Preferably, the method further includes determining when degradation in the span has occurred before the degradation develops into an open span.

In another embodiment of the method of the present invention, the method comprises the steps of continuously monitoring both an out-of-band ASS power level and a pump back-reflection level; detecting when changes in the monitored power levels signify an open span; and, responsive to the detection result, reducing the level of Raman pump energy entering the span to a safe level. Preferably, the method further includes determining, based on the magnitude of changes in the monitored power levels, the approximate position of the opening and the type of opening (open connector of fiber break), once an open span has occurred In yet another embodiment of the method of the present invention, the method comprises the steps of continuously monitoring an out-of-band ASS power level, a pump back-reflection level, a supervisory channel modulation power level, and a total power level within the communication band; detecting when changes in the monitored power levels signify an open span; and, responsive to the detection result, reducing the level of Raman pump energy entering the span to a safe level. Preferably, the method further includes determining, based on the magnitude of changes in the monitored power levels, the approximate position of the opening and the type of opening (open connector of fiber break), once an open span has occurred.

In yet another embodiment of the method of the present invention, the method comprises the steps of continuously monitoring an out-of-band ASS power level, a pump back-reflection level, a total power level within the communication band entering the amplifier from the amplified span, and a total power level within the communication band entering the amplifier from the previous span; detecting when changes in the monitored power levels signify an open span; and, responsive to the detection result, reducing the level of Raman pump energy entering the span to a safe level. Preferably, the method further includes determining, based on the magnitude of changes in the monitored power levels, the approximate position of the opening and the type of opening (open connector of fiber break), once an open span has occurred.

BRIEF DESCRIPTION OF THE DRAWINGS

The invention is herein described, by way of example only, with reference to the accompanying drawings, wherein.

The drawings and descriptions are meant to illuminate and clarify the invention, but should not be considered limiting in any way. In particular, variations and modifications apparent to those skilled in the art may be considered without departing from the claimed scope of the invention.

DETAILED DESCRIPTION OF THE PREFERRED EMBODIMENTS

Figure 1:
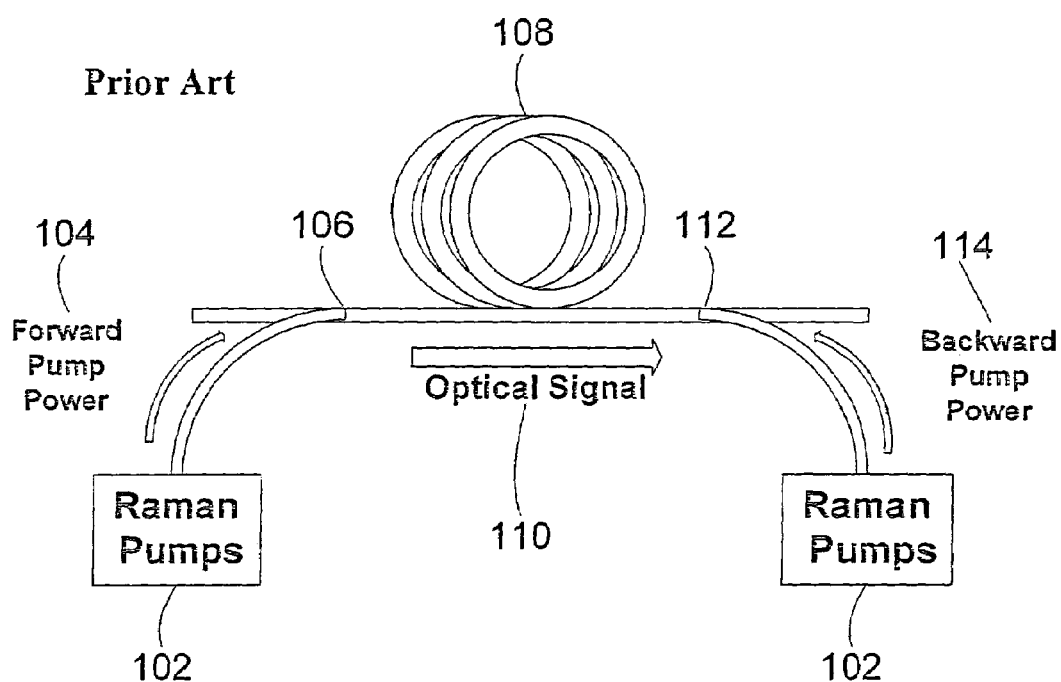
FIG. 1 shows an example of a span of a communication link employing Raman amplification, as known in prior art.
Figure 2:
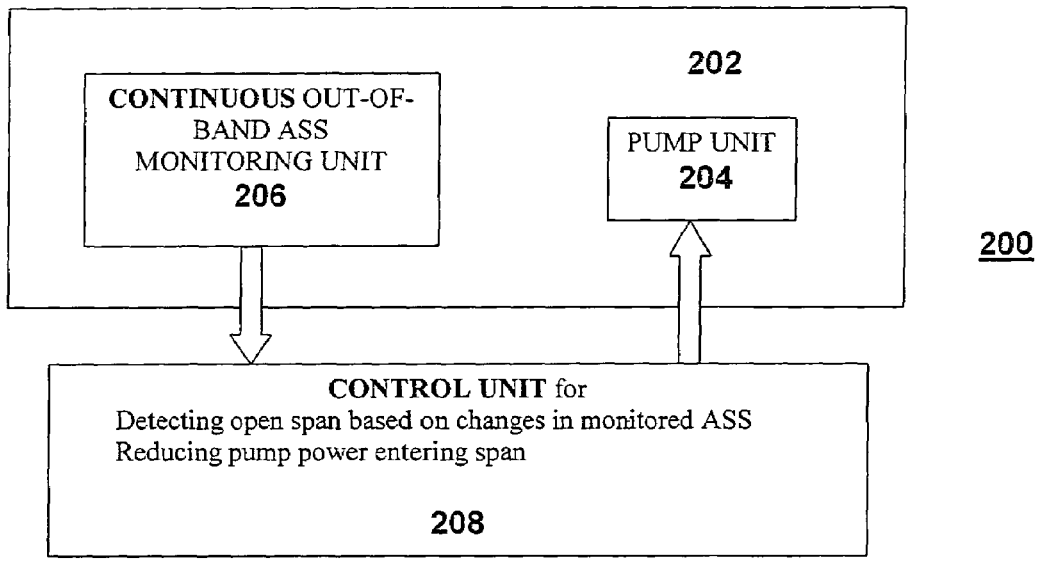
FIG. 2 shows schematically a block diagram of a preferred embodiment of the system of the present invention.

FIG. 2 shows schematically a preferred embodiment of a distributed Raman amplification system 200 of the present invention. System 200 comprises a Raman pump unit 204 operative to provide a Raman pump energy that comprises one or more Raman pump wavelengths to the span to be amplified (see below), and an apparatus for continuous out-of-band ASS monitoring 206, the monitoring providing an ASS power output. System 200 further comprises a control unit 208 operative to detect and analyze in real-time changes in the ASS power, and upon determination that such changes indicate an open span, reduce the level of the Raman pump energy entering the span to a safe level.

Figure 2A:
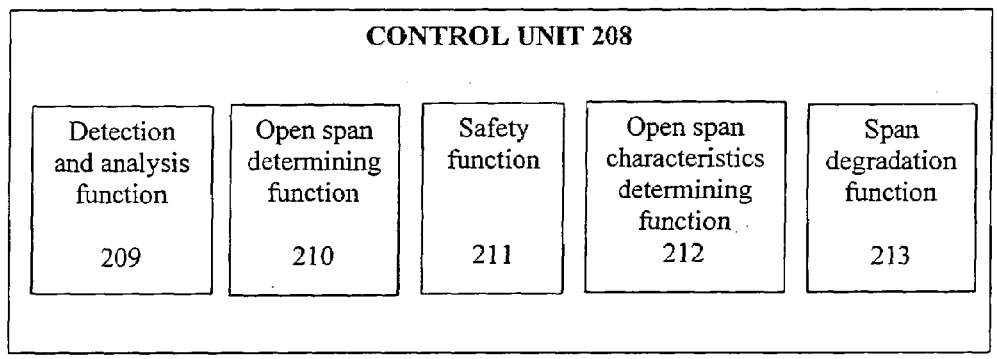
FIG. 2a shows the control unit of FIG. 2 in more detail.

FIG. 2a shows the control unit 208 in more detail. The control unit includes a detection and analysis function 209 to detect and analyze in real-time changes in the out-of-band ASS power level, an open span determining function 210 to determine whether the change in out-of-band ASS power level indicates an open span, and a safety function 211 activated when the open span is determined, to effect a reduction of the Raman pump energy entering the span. The control unit optionally further includes an open span characteristics determining function 212 operative to determine the approximate position of the opening in the open span based on the magnitude of change in the out-of-band ASS power level. The control unit optionally further includes a span degradation function 213 operative to detect degradation in the span before the degradation develops into an open span.

In a preferred embodiment of the method of the present invention, the method comprises the steps of continuously monitoring an out-of-band ASS power level using monitoring unit 206; detecting when changes in the out-of-band ASS power level signify an open span using control unit 208; and, responsive to the detection result, activating pump unit 204 to reduce the pump energy entering the span to a safe level. Other embodiments of the method may include additional and or optional steps and sub-steps, described in more detail below.

Figure 3:
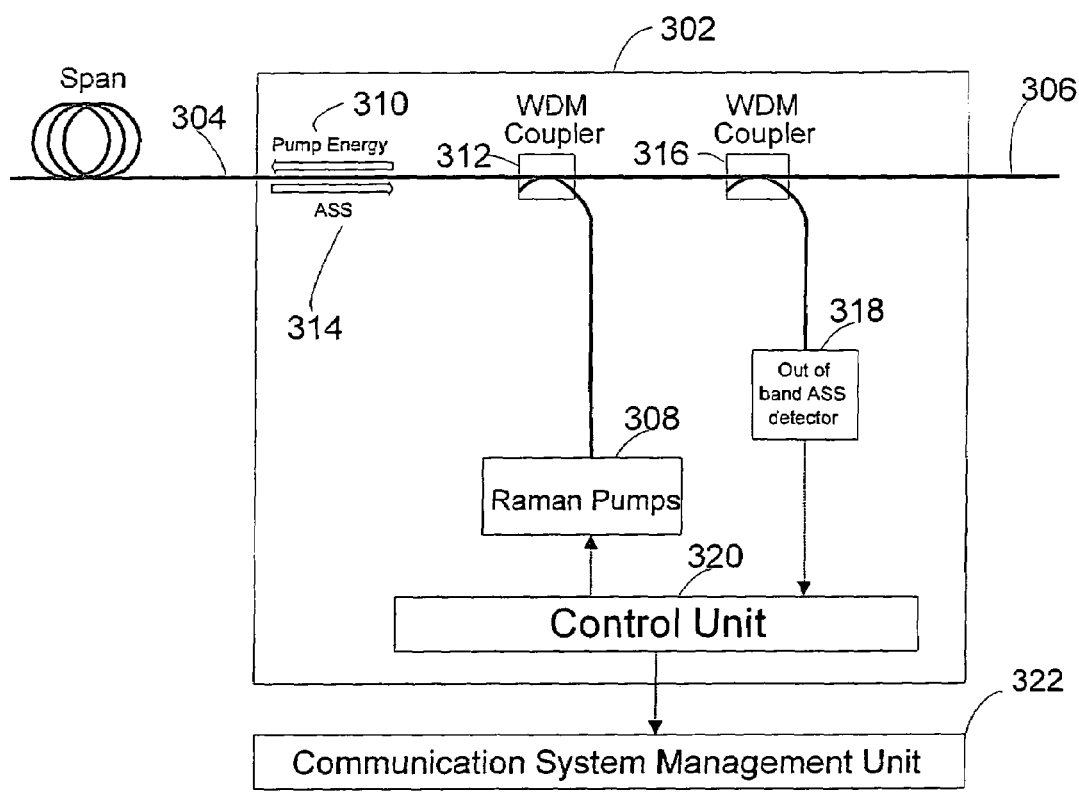
FIG. 3 shows a more detailed diagram of a preferred embodiment of the system of the present invention.

FIG. 3 shows schematically more details of the system of FIG. 2. The figure shows a distributed Raman amplification system 302, in either forward or backward configuration. Only those features of system 302 relevant to the current invention are shown, and it is assumed that other features known in the art may be incorporated within system 302. The amplification system is connected at one port 304 to the span to be amplified and at another port 306 to the preceding span in the case of forward configuration, or to the following span in the case of backward configuration (the connection to the preceding or following span may be via an optional lumped amplifier, such as an EDFA). Raman pumps 308 supply pump energy 310 to the span via a first WDM coupler 312, which couples the wavelengths of the Raman pumps with the signal channels co-propagating (in the case of forward configuration) or counter-propagating (in the case of backward configuration) along the span.

Figure 4:
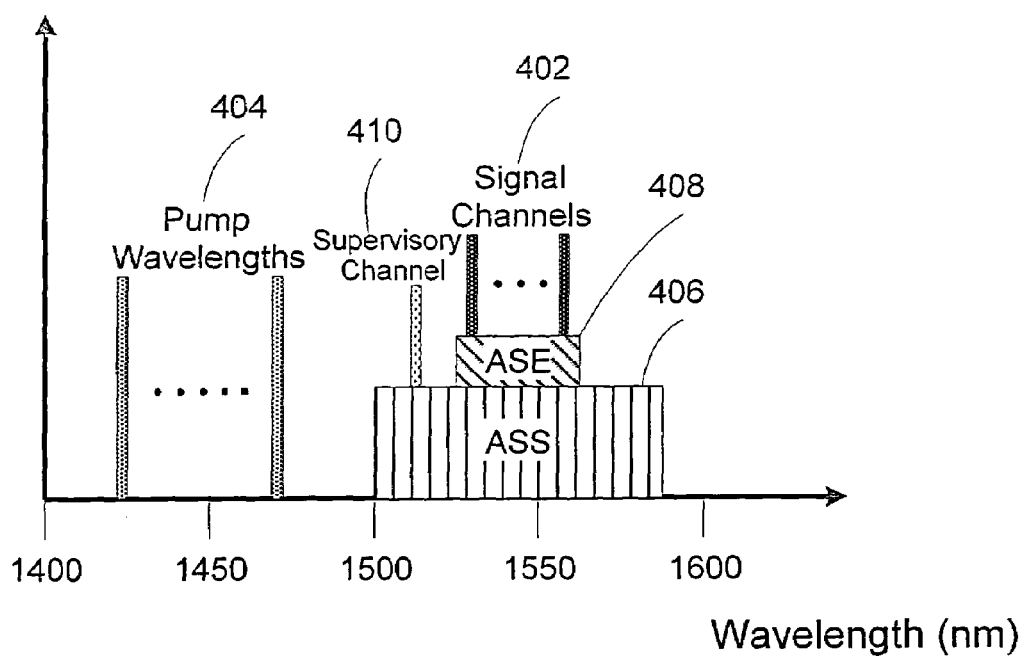
FIG. 4 shows an example of the position within the wavelength spectrum of pump energy wavelengths, signal channels, supervisory channel, and amplified spontaneous scattering (ASS)

In a typical example, illustrated schematically in FIG. 4, signal channels 402 will occupy the C band (1525–1565 nm) used for communication, while Raman pump wavelengths 404 will occupy the 1420–1480 nm band. As the pump energy propagates along the span, part of it is transferred to the signal channels via stimulated Raman scattering, thus leading to signal amplification. In addition, spontaneous Raman scattering occurs, which creates noise within a wavelength band defined by the Raman pump wavelengths and the Raman gain spectrum of the fiber. By design, this wavelength band fully contains the communication band (in order to amplify the signal channels), but typically also contains bands adjacent to the communication band. In the above-mentioned typical example, spontaneous Raman scattering is also created in the so called short band (1500–1520 nm) adjacent to the C band. The noise power created by spontaneous Raman scattering propagates in both direction (i.e. with the pump energy, and counter to the pump energy), and also undergoes stimulated amplification by the pump energy as it propagates, resulting in amplified stimulated scattering (ASS) 406. For the sake of completeness, FIG. 4 also illustrates an amplified spontaneous emission (ASE) noise 408 created by optional EDFAs placed elsewhere in the communication link. Also shown is an optional supervisory channel 410, which will be discussed further herein below.

Returning now to FIG. 3, the part (314) of the ASS that propagates from the span back towards the Raman amplification system is input to a second WDM coupler 316, which separates a certain wavelength band containing out-of-band ASS. In the typical example described above, this wavelength band could be the so called short band (1500–1520 nm). The power in this wavelength band is directed by WDM coupler 316 to an out-of-band ASS detector 318. This detector continuously monitors the power level of the out-of-band ASS, and passes this information to a control unit 320 (equivalent to unit 208 in FIG. 2). Control unit 320 is used to detect and analyze changes in the ASS power level, and upon determination that such changes indicate an open span, reduce the level of the Raman pump energy entering the span to a safe level.

Figure 5:
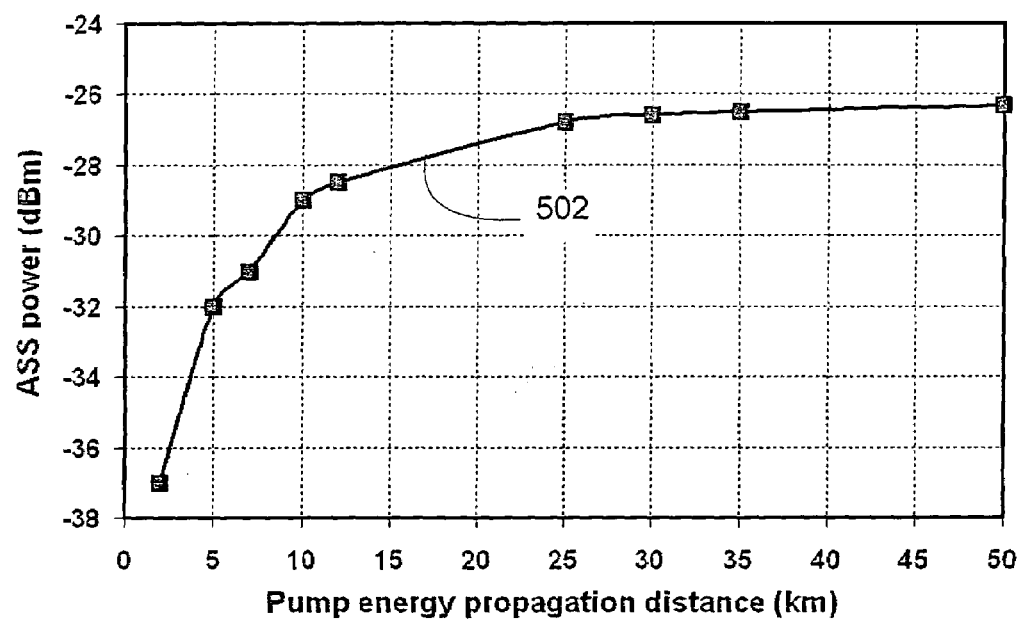
FIG. 5 shows an example graph showing the detected power level of ASS in the short band (1500–1520 nm) entering the amplifier from the span, as a function of the propagation distance of the pump energy along the span.

In order to understand how this is accomplished, we turn now to FIG. 5, which shows an example of the level of ASS power within the short band (1500–1520 nm) detected by the amplification unit, as a function of the propagation distance of the pump energy along the span. The absolute level of ASS power depends on the output power of the Raman pumps and their wavelengths, as well as on the properties of the transmission fiber. The example shown in FIG. 5 corresponds to a total pump output power of about +27 dBm, propagating over G652 transmission fiber (so called standard single mode fiber, S-SMF). However, the overall shape of a curve 502 is expected to be similar for different pump configurations and output powers, as well as different transmission fibers. In particular, the rate of change of the detected ASS power with propagation distance is independent in most practical cases of the pump output power. This means that we do not require an independent monitoring of the pump output power in order to analyze changes in the detected ASS power level, in contrast to the invention in US Patent Application No. 2004/0090663. The graph of FIG. 5 shows us that the further the pump energy propagates along the span, the more ASS power will be detected by the amplification system. This is easily understood, since more Raman spontaneous scattering will occur as the pump energy propagates further into the span. The graph also shows that the detected ASS power level increases at a slower rate as the pump energy propagates further, eventually saturating at a maximum value. This is due to the fact that as the pump energy propagates along the span, it is attenuated by the transmission fiber, thus in turn creating less spontaneous Raman scattering. It should be noted that while FIG. 5 relates specifically to ASS in the short band, it illustrates a characteristic behavior of ASS in general, whether in-band, out-of-band, or a combination of both.

Typically, a span utilizing Raman amplification will be at least 80 km long, so that in the example illustrated by FIG. 5, the ASS power level detected by the amplifier during normal operation will be at the maximum saturated value, about −26 dBm. Now assume that a fiber break or cut occurs, or a connector is opened, at some point along the span. Since the Raman pump power will only propagate up to that point, the power level of ASS detected by the amplification system will change according to the graph in FIG. 5. If the point of the opening occurs close enough to the amplification system, then the change in ASS power level will be significant enough to be detected with a high level of certainty. In the example of FIG. 5, an opening occurring within about 30 km of the amplifier will cause a decrease in the detected ASS level of at least 0.5 dB, which should be easily detected over any noise or random fluctuations.

Returning now to FIG. 3, upon detection of an open span, control unit 320 then activates a reduction of the pump energy 310 entering the span to a safe level. In a preferred embodiment, this is achieved by activating a complete shutdown of Raman pumps 308.

It should be noted that while span openings occurring further than a certain critical distance from the amplification system (about 30 km in the example of FIG. 5) cannot be detected, such openings are less hazardous since the pump power is strongly attenuated before reaching the opening. In fact, the critical distance is inherently related to the distance at which the pump power decreases below the Raman threshold, so that the pump power at openings occurring further than the critical distance will necessarily be below the Raman threshold.

It should further be noted that in order for the control unit 320 to function correctly, all that is required is a clean reading of the ASS power level entering the amplification system from the span. In the preferred embodiment of the system described above, this can be achieved easily and with minimum cost by monitoring part of the out-of-band ASS (for example, within the short band). The monitored region of the out-of-band ASS is selected such that it contains minimum interference (such as signal channels and/or ASE from EDFAs), thus allowing a cost effective and simple detection method to be used. However, one could envision variations of the invention where other regions of out-of-band ASS are monitored, and even in-band ASS.

Control unit 320 may further include a function to determine the approximate position of the opening (equivalent to 212 in FIG. 2a), once an open span has been detected. This can be accomplished by analyzing the magnitude of the change in ASS, and translating this to position using, for example, a look-up table corresponding to a graph such as FIG. 5. In the example shown in FIG. 5, a decrease of 2 dB in the ASS corresponds to a span opening within 10–15 km of the amplification unit, whereas a decrease of 4 dB corresponds to a span opening within 5–10 km of the amplification system.

Control unit 320 may further include a function to determine when a degradation of the amplified span has occurred, before such degradation develops into an open span (equivalent to 213 in FIG. 2a). For example, a loose connector or fiber bend may cause a slight decrease in the ASS power level detected by the amplification system. Using the example of FIG. 5, a decrease of 0.3 dB may not be significant enough to indicate an open span, but may indicate a degradation which should be attended to by the communication system manager.

Control unit 320 may further pass information to a communication system management unit 322, which is normally part of the larger communication system. This information may include the occurrence of the open span (for example, in the form of an alarm), as well as the position of the opening as determined by the control unit. The information may also include an alarm indicating a possible span degradation, as described above.

Figure 6:
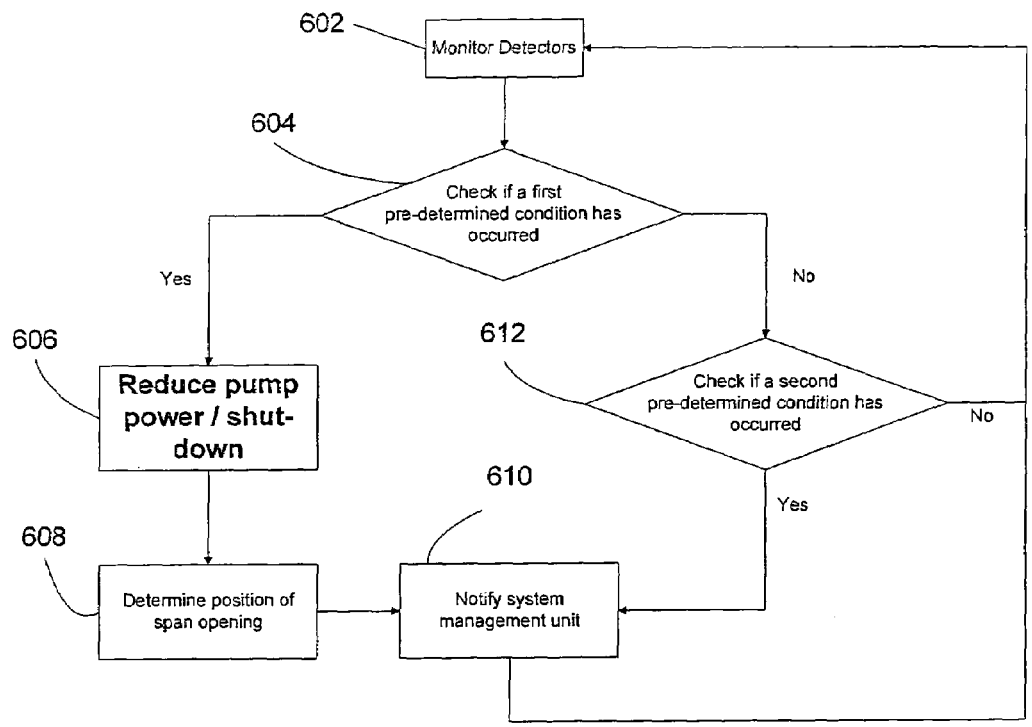
FIG. 6 shows an exemplary flow chart of the method of the present invention.

FIG. 6 shows a general flowchart relevant to all embodiments of the method of the present invention. A first step 602 is used to monitor the detectors, which in the case of the preferred embodiment just described means monitoring only the out-of-band ASS detector. Each time the detector is monitored, a check 604 is performed to ascertain whether a first pre-determined condition (further described below) that signifies an open span has occurred. If such a condition has occurred, then step 606 is executed, which activates a reduction of pump power entering the span to a safe level, or preferably, activates a shutdown of the pump unit. Following execution of step 606, a first optional step 608 is executed to determine the approximate position of the opening within the span. A second, optional step 610 of notifying the communication system management unit is then executed, before control is returned to step 602 and the process starts again. Optionally, if the first pre-determined condition of step 604 is not fulfilled, then a second pre-determined condition (further described below) is checked in step 612. The purpose of this second condition is to identify a degradation of the span before an open span occurs. If this second condition is not fulfilled, then control is passed back to the first step 602, and the entire process is started again. If the second condition step then the communication system management unit is notified in step 610, before control is passed back to first step 602, and the entire process is started again.

In a preferred embodiment of the method, step 604 is executed with a frequency large enough to ensure that the reduction of the pump energy will occur within an eye-safe time of the occurrence of the open span. In a typical example step 604 is executed every few milliseconds (i.e. a frequency of about 1 KHz).

In a preferred embodiment of the method, the first pre-determined condition of step 604 is that the level of ASS power has decreased by P1 dB within a time shorter than T1. The time T1 should be long enough to enable detection of different processes, which result in an open span. For example, if an operator accidentally opens a connector during pump operation, the time T1 should be long enough to allow detection of the change in ASS that occurs during the process of the connector being opened. However, the time T1 should not be so long as to encompass slow changes in ASS due to, for example, environmentally induced fluctuations, or aging. A typical example for the time T1 may be about 0.1 second. The value P1 should be selected such that it is larger than random noise or fluctuations, but small enough to identify an open span occurring as far as possible from the amplifier. In the example corresponding to FIG. 5, the pre-determined change could be defined as 0.5 dB. This is large enough to rule out noise and random fluctuations, and it would allow detection of an open span occurring within about 30 km of the amplifier.

In an another embodiment of the method, the first pre-determined condition of step 604 includes additional sub-conditions to that just described, and the entire first pre-determined condition is true if at least one of the sub-conditions is true.

An example of an additional sub-condition may be that step 604 is being executed the first time after a time T2 has elapsed since the amplification system was powered on, and the level of ASS power is below P2 dBm. The time T2 is selected to be long enough such that the pump power has reached a stable level, but shorter than the eye-safe time (for example, when the total pump power is below +27 dBm, T2 may be set at about 0.1 second). P2 is selected to represent the minimum expected ASS level when there is no open span. In the example of FIG. 4, P2 would be set to about −26 dBm. This sub-condition ensures that if an open span exists when the amplifier is powered on, then the amplifier will be immediately shut down within an eye-safe time.

An additional example of a sub-condition may be that the level of ASS power has decreased by P3 dB relative to the level monitored the first time the amplifier was powered on. This sub-condition is meant to encompass cases where there may be a slow but large deterioration in the ASS power level, and may be viewed as an extra safety precaution. In the example corresponding to FIG. 5, P3 could be set to about 2 dB.

The second pre-determined condition of step 612 is similar in nature to the first pre-determined condition of step 604, with the general difference that the change in the ASS power level are smaller, and/or more gradual. Thus, for example, the power levels P1 and P3 described above could be smaller than in step 604, and/or the time T1 could be longer. This would enable possible identification of a span degradation before it develops into an open span.

Figure 7:
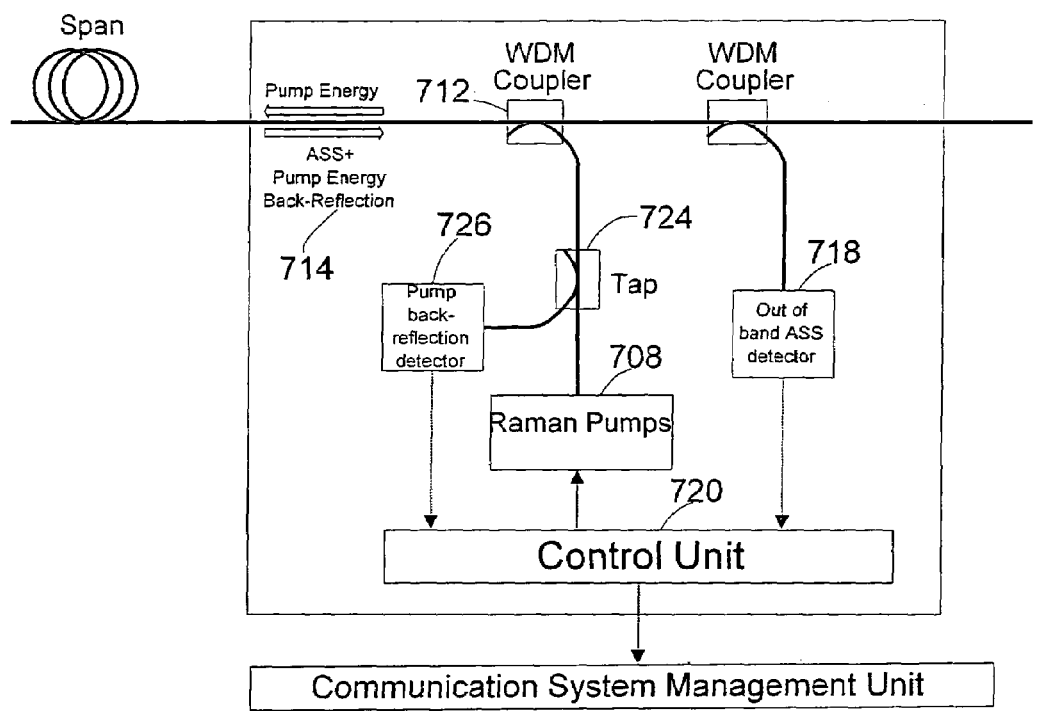
FIG. 7 shows a detailed diagram of another embodiment of the system of the present invention.

FIG. 7 shows another embodiment of the system of the present invention, comprising essentially the same elements as shown in FIG. 3, with added elements operative to additionally enable detection of an open span based on changes in the pump energy back-reflection level. As pump energy propagates along the span, part of it is back reflected due to Rayleigh backscattering occurring continuously within the transmission fiber. As opposed to Raman scattering, Rayleigh backscattered power is in the same wavelength as the original pump energy, and thus separate from ASS (see FIG. 4). Furthermore, back reflection may occur due to splices, connectors and other anomalous points occurring along the span, contributing to the total back-reflected pump power which is part of light 714 entering the amplification system from the span.

The total back-reflected pump power contained within light 714 entering the amplification system from the span is separated by WDM coupler 712 and directed back to Raman pumps 708. A tap 724 then diverts part of the back-reflected power to a pump back-reflection detector 726. This detector continuously monitors the level of the back-reflected pump power, and passes the information to control unit 720, which is simultaneously receiving information from out-of-band ASS detector 718.

Figure 8:
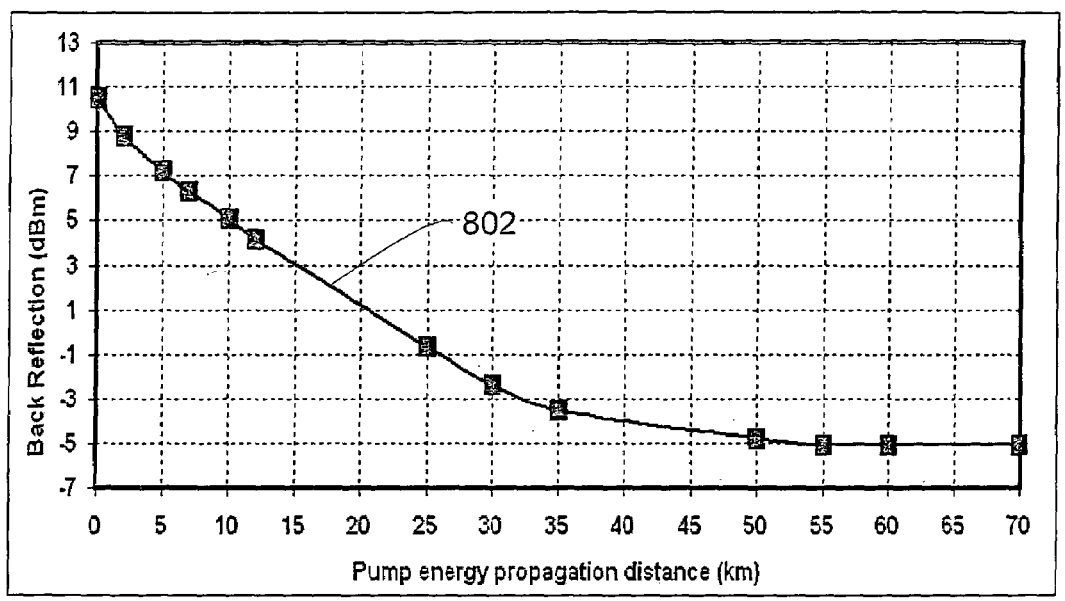
FIG. 8 shows an example graph showing the detected pump energy back-reflection level as a function of the position of an open connector within the span.

FIG. 8 shows an example graph of the pump energy back reflection level detected by the amplification system as a function of the distance of an open PC connector from the system. The absolute level of detected pump energy back-reflection depends on the pump output power, as well as the type of transmission fiber. The example illustrated in FIG. 8 refers to an output power of about +27 dBm, and a G652 transmission fiber (S-SMF). However, the general behavior of curve 802 is similar for other pump output powers, and other types of transmission fiber. As the graph shows, if the open PC connector is adjacent to the amplifier, then the back-reflection level is about +11 dBm. If the open connector is positioned further away from the amplifier, then the pump power is attenuated before reaching the open connector, and the back-reflected power is further attenuated before reaching the amplifier, thus leading to a reduction in the detected back-reflection level. The graph also shows that the detected back-reflection level saturates to a minimum of about −6 dBm when the distance to the open connector is above about 55 km. This minimum level corresponds to the level of Rayleigh backscattering always present in the fiber, and masks the contribution of the open connector when the latter is sufficiently small.

As noted previously, a typical span utilizing Raman amplification will be at least 80 km long. Thus, assuming there is no open connector within the span, then in the example illustrated by FIG. 8 the pump energy back-reflection level detected by the amplification system during normal system operation will be at the minimum value of about −6 dBm. If we now assume that a connector is opened at some point along the span, then the detected back reflection level will increase according to the graph of FIG. 8. If the point of the opening occurs close enough to the amplification system, then the increase in the detected back reflection level will be significant enough to be detected with a high level of certainty. Furthermore, the degree of change in the back-reflection can be used as an indicator of the position of the opening. In the example of FIG. 8, an opening occurring within 45 km of the amplification system will cause a change in the detected back-reflection level of at least 0.5 dB, which should be easily detected over any noise or random fluctuations.

Thus, control unit 720 may detect an open span through changes in both the ASS and pump back-reflection power levels. Utilizing changes in ASS allows detection of any type of open span, up to 30 km from the amplification unit in the example of FIG. 6, while utilizing pump power back-reflection allows detection of open connectors, up to 45 km from the amplification unit in the example of FIG. 8.

Control unit 720 may further contain a function to calculate the position of the span opening, once an open span has been detected. This calculation may be accomplished using look-up tables corresponding to graphs as exemplified by FIG. 5 and FIG. 8. The function may also determine the type of open span, such as a connector opening or fiber cut or break. For example, a change in ASS not accompanied by a change in pump back-reflection signifies that a fiber break has occurred, as opposed to a connector opening.

A further embodiment of the method of the present invention may be described with reference again to the flowchart of FIG. 6. In this case, the first pre-determined condition of step 604 includes additional sub-conditions to those described in the previous embodiments.

An additional sub-condition may be that the level of pump back-reflection power has increased by P4 dB within time shorter than T1, where T1 has the same meaning as described above. In the example corresponding to FIG. 8, P4 could be set to 0.5 dB, allowing detection of an open connector occurring within about 45 km of the amplifier.

An additional sub-condition may be that step 604 is being executed the first time after a time T2 has elapsed since the amplifier was powered on, and the level of pump back-reflected power is above P5 dBm. The time T2 has the same meaning as described above. In the example of FIG. 8, P5 would be set to about −6 dBm. This sub-condition ensures that if an open connector exists when the amplifier is powered on, then the amplifier will be immediately shut down within an eye-safe time.

An additional sub-condition may be that the level of pump back-reflected power has decreased by P6 dB relative to the level monitored the first time the amplifier was powered on. This sub-condition is meant to encompass cases where there may be a slow but large increase in the pump back-reflection power level, and may be viewed as an extra safety precaution. In the example corresponding to FIG. 8, P6 could be set to about 2 dB.

The second pre-determined condition of step 612 is similar in nature to the first pre-determined condition of step 604, with the general difference that the changes in the power levels are smaller, and/or more gradual. Thus, for example, the power levels P1, P3, P4 and P6 described above could be smaller than in step 704, and/or the time T1 could be longer.

Figure 9:
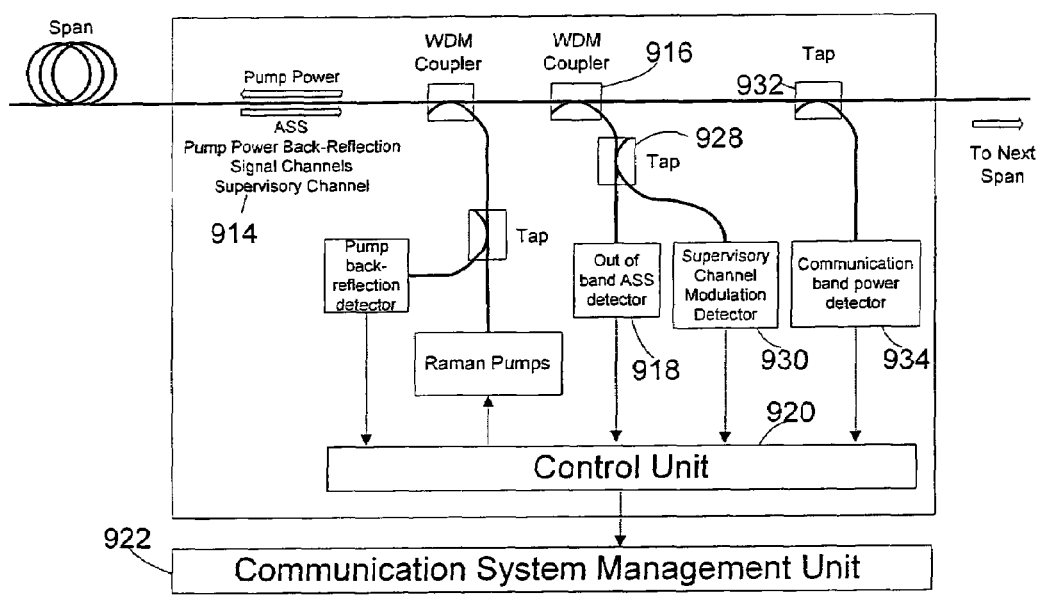
FIG. 9 shows a detailed diagram of yet another embodiment of the system of the present invention.

FIG. 9 shows yet another embodiment of the system of the present invention, relating specifically to a distributed Raman amplification system working in backward configuration. The system described in FIG. 9 comprises essentially the same elements as shown in FIG. 7, with added elements operative to additionally enable detection of an open span based on changes in the power level of a supervisory channel and changes in the power level within the communication band. Since the amplification system is designated to work in backward configuration, incoming light 914 can be assumed to contain the signal channels used for communication, and an optional supervisory channel used for the communication system management.

Most optical communications systems utilize a supervisory channel to transfer information between various elements of the system, as well as to monitor system integrity. This supervisory channel is often located near the communication band containing the signal channels, though not within it. In the typical example illustrated in FIG. 4, the supervisory channel is located in the so-called short band (1500–1520 nm), in the vicinity of 1510 nm. The supervisory channel may also be modulated to facilitate simple and cost effective monitoring of the power within the channel, even in the presence of a large amount of noise in the spectral vicinity of the channel. In a typical example the modulation comprises an analog AC dither of part of the channel power, typically in the frequency range 300–1500 kHz.

In a preferred implementation, the wavelength band used for detection of the out-of-band ASS is selected to contain the supervisory channel within it. In a typical example this wavelength band corresponds to the short band (1500–1520 nm), with the supervisory channel being located at 1510 nm. In such a case, a WDM coupler 916 separates the supervisory channel together with the out-of-band ASS from the signal channels, and routes the separated wavelength band towards an out-of-band ASS detector 918, via a tap 928. Tap 928 routes a small fraction of the power within the wavelength band towards a supervisory channel modulation detector 930. Detector 930 is designed to be locked to the frequency of the supervisory channel dither, thus allowing the detection of the power level of the supervisory channel even in the presence of a large amount of noise (such as ASS) within the wavelength band. Detector 930 then passes the information regarding the supervisory channel power level to a control unit 920. Note that while the supervisory channel power also reaches an out-of-band ASS detector 918, it does not interfere with the detection of the ASS power level. The reason for this is that the supervisory channel power is much smaller than the ASS power level during normal operation, and is not present when an open span occurs. Thus, a graph such as that of FIG. 6 still governs the behavior of the power detected by out-of-band ASS detector 918. In a typical example the supervisory channel power entering the amplifier will be below −35 dB, whereas according to FIG. 6, the level of out-of-band ASS during normal operation (i.e. no open span) is about −26 dB. Thus, the presence of the supervisory channel changes the normal operating level of ASS by at most 0.5 dB, which can easily be accounted for by the function of control unit 920.

In another implementation, the wavelength band used for detection of out-of-band ASS does not contain the supervisory channel, which resides in another region of the wavelength spectrum. In this embodiment, tap 928 is redundant, and another WDM coupler (not shown) is placed between WDM coupler 916 and tap 932. This new WDM coupler then routes the supervisory channel to supervisory channel modulation detector 930, which works as previously described.

In either of the above two implementations, it may be beneficial to provide the communication system management unit direct optical access to the supervisory channel (for example, to add/drop maintenance data to this channel). In such a case, an additional splitter (not shown) may be placed directly prior to detector 930, and part of the optical power diverted to an external port (not shown) of the amplification unit.

In either of the above two implementations, light reaching tap 932 should only contain optical power within the communication band, the remaining optical power being diverted by preceding WDM couplers. Tap 932 then diverts a fraction of the communication band power to a communication band power detector 934. This detector continuously monitors the total power within the communication band, and passes the information to control unit 920.

In some cases, it may be beneficial to provide the communication system management unit direct optical access to the communication band power. In such a case, an additional splitter (not shown) may be placed directly prior to detector 934, and part of the optical power diverted to an external port (not shown) of the amplification unit.

Thus, control unit 920 is continuously and simultaneously receiving information from the following detectors: out-of-band ASS detector 918; pump back-reflection detector 926; supervisory channel modulation detector 930; and communication band power detector 934. Based on the detection and analysis of the changes in all the monitored powers, the control unit then determines whether an open span has occurred. The control unit may further include a function to determine, once an open span has been detected, the position and type of span opening. For example, if a significant change occurs in the supervisory channel power, but no change occurs in the ASS power, the open span may be assumed to be further than 30 km (in the example corresponding to FIG. 5) from the amplifier unit.

A further embodiment of the method of the present invention may be described with reference again to the flowchart of FIG. 6. In this case, the first pre-determined condition of step 604 includes additional sub-conditions to those described in the previous embodiments.

An additional sub-condition may be a simultaneous decrease of P7 dB in the supervisory channel power, and P8 dB in the communication band power. Here simultaneous means both changes occur within the same time span of length T1, where T1 is the same previously described. This sub-condition allows detection of an open span anywhere along the span, provided the supervisory channel is present and operational. Relying on the supervisory channel alone opens up the possibility of unwarranted activation of the safety mechanism upon a failure of the supervisory channel that is unrelated to an open span. On the other hand, the power in the communication band can change due to add/drop of channels, so that it is impractical to rely only on it to detect an open span. However, the combination of changes in both the supervisory channel power and communication band power allow a relatively error-proof and definite detection of an open span. If an open span occurs, then the power in the supervisory channel and all signal channels will disappear completely and simultaneously. Since the power in the supervisory channel is directly detected with the aid of the modulation discussed above, the detected power will change significantly, so that P7 can be set to a high level, for example to 3 dB. On the other hand, the detected power in the communication band contains not only the signal channels, but also ASS. Depending on the position of the open span, the level of ASS may remain constant, thus reducing the effect of the disappearance of the signal channels. For example, assuming Raman pump power of about +27 dBm, G652 transmission fiber, and the communication band corresponding to the C band, the level of ASS power within the communication band may be as high as −20 dBm. Then, assuming the worst case that a single signal channel is present in the system, and that the signal channel power incoming to the amplifier is −35 dBm, the disappearance of the signal channel will cause a reduction of only 0.13 dB in the total detected communication band power. Thus P8 should be set to a relatively low level, for example 0.2 dB.

An addition sub-condition may be a simultaneous (in the same sense as just described) decrease of P9 dB in the out-of-band ASS power, and P10 dB in the communication band power. This sub-condition is useful in the cases where there is no supervisory channel, or the supervisory channel has failed. In general, P9 may be set to a lower level compared to sub-condition a (for example, 0.2 dB compared to 0.5 dB dB in the example of FIG. 5), due to the added condition of decrease in communication band power. P10 may be set to, for example, 0.2 dB, as explained above.

The second pre-determined condition of step 612 is similar in nature to the first pre-determined condition of step 604, with the general difference that the changes in the power levels are smaller and/or more gradual.

Figure 10:
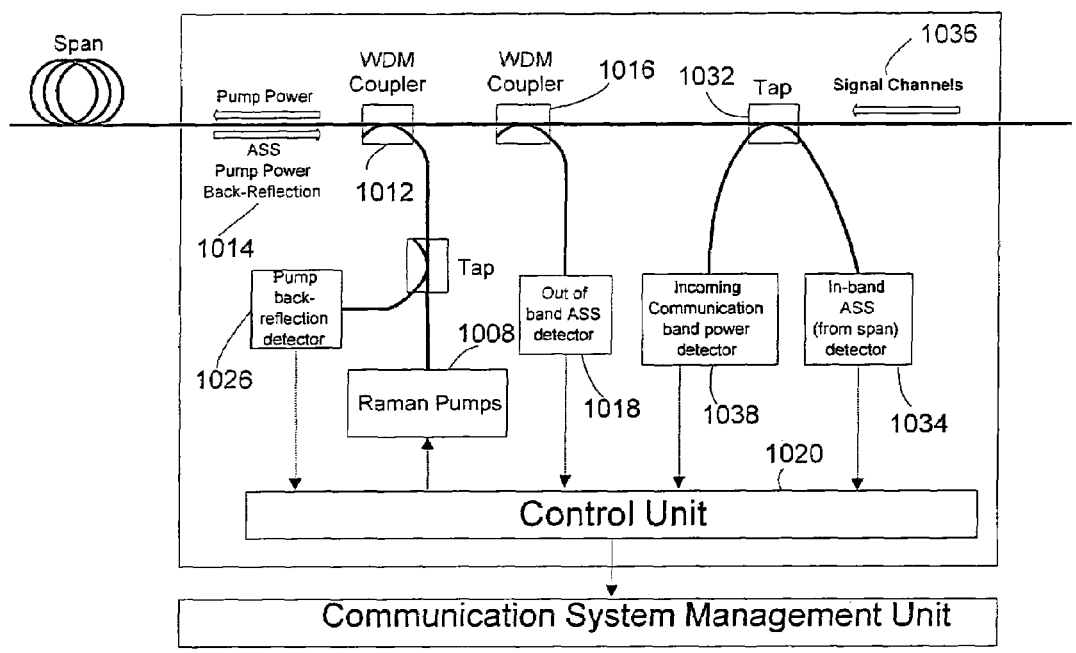
FIG. 10 shows a detailed diagram of yet another embodiment of the system of the present invention.

FIG. 10 shows yet another embodiment of the system of the present invention, relating specifically to a distributed Raman amplification system working in forward configuration. The system described in FIG. 10 comprises essentially the same elements as shown in FIG. 7, with added elements operative to additionally enable detection of an open span based on changes in the power level within the communication band of light entering from both ports of the amplification unit. Since the amplification unit is designated to work in forward configuration, light 1014 incoming from the amplified span does not contain signal channels. Thus, a major contribution to the communication band component of this light is in-band ASS generated within the span. This could potentially enable the use of in-band ASS to complement or replace the use of out-of-band ASS, especially considering that there is typically more in-band ASS than out-of-band ASS. However, a complicating factor in the use of in-band ASS is Rayleigh backscattering of signal channels propagating along the span, and subsequent amplification of the backscattered power. Thus, a backscattered replica, however weak, of the signal channels is included in the communication band component of light 1014 incoming from the amplified span, which means that this component is sensitive to add/drop of signal channels, and does not provide a clean measure of ASS. To overcome this problem one can also monitor the incoming light 1036, which provides an independent reading of the signal channels.

The communication band component of light 1014 passes WDM couplers 1012 and 1016, and reaches tap 1032 where a fraction of it is diverted to in-band ASS detector 1034. Another detector 1038 is connected to the remaining port of tap 1032, so that it receives a fraction of the incoming light 1036. Both these detectors pass information to the control unit 1020, so that the control unit receives independent readings of the communication band power incoming from both ends of the amplifier. This is in addition to receiving information from detectors 1018 and 1026 regarding the out-of-band ASS level and the level of back-reflected pump power. Based on the detection and analysis of the changes in all the monitored powers, the control unit then determines whether an open span has occurred.

A further embodiment of the method of the present invention may be described with reference again to the flowchart of FIG. 6. In this case, the first pre-determined condition of step 604 includes additional sub-conditions to those described in the previous embodiments.

An additional sub-condition may be a decrease of P7 dB in the communication band power incoming from the span, but no change in the power incoming from the other end of the amplifier (i.e. from the previous span). This sub-condition provides for a change in the in-band ASS, providing that the power incoming from the other end of the amplifier does not change. This prevents accidental activation of the safety mechanism during signal channel add/drop, as discussed above. The level P7 is set using a graph similar to that shown in FIG. 5, but calibrated to take into account the amplified Rayleigh backscattering of the signal channels.

Figure 11:
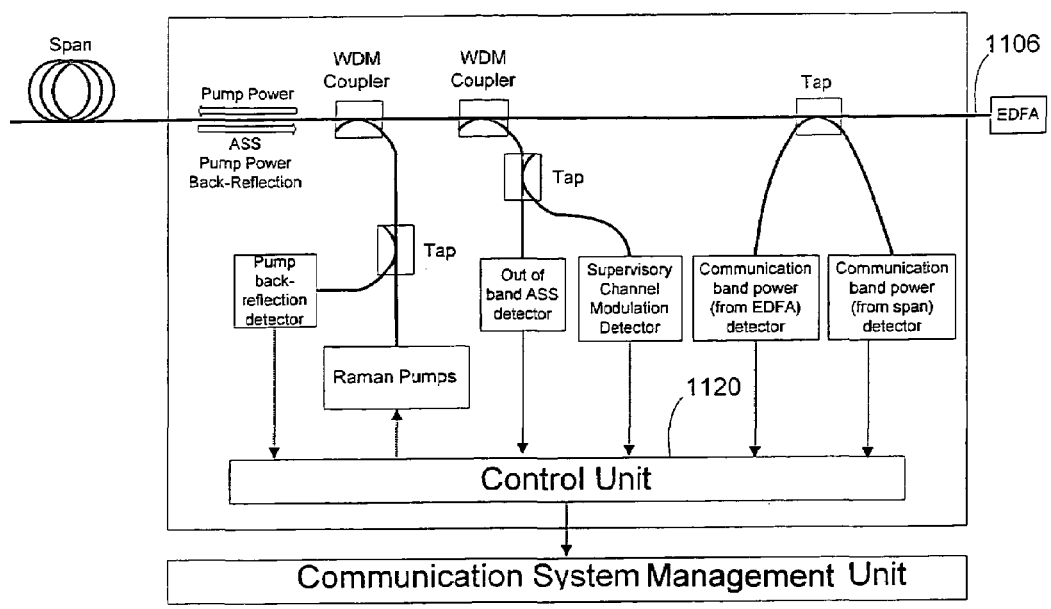
FIG. 11 shows a detailed diagram of a system that can work in either forward or backward configurations.

FIG. 11 shows an amplification system, which can work in either forward or backward configuration, according to one of previous two embodiments of the system of the present invention. In such a case the configuration of the amplification system, and the appropriate functioning of the control unit 1120, is defined though software within the control unit. The elements of FIG. 11 are analogous to those of FIG. 9 and FIG. 10, with their function being determined by which configuration the amplifier is working in. In FIG. 11, a port 1106 is connected to the next span in the case of backward configuration, or the previous span in the case of forward configuration. In either case this connection usually takes place via an EDFA, as shown in the figure. However, the EDFA may be replaced by some other type of lumped amplifier, or there may be no amplifier at all.

All publications, patents and patent applications mentioned in this specification are herein incorporated in their entirety by reference into the specification, to the same extent as if each individual publication, patent or patent application was specifically and individually indicated to be incorporated herein by reference. In addition, citation or identification of any reference in this application shall not be construed as an admission that such reference is available as prior art to the present invention.

While the invention has been described with respect to a limited number of embodiments, it will be appreciated that many variations, modifications and other applications of the invention may be made.

What is claimed is:

1. A distributed Raman amplification system with enhanced eye-protection functionality comprising:
   a. a pump unit for introducing Raman pump energy, comprising one or more pump wavelengths, into an optical communication network span;
   b. a monitoring unit for continuously measuring the power level of out-of-band amplified spontaneous scattering (ASS) entering the Raman amplifier from said span; and
   c. a control unit operative to reduce the level of said Raman pump energy entering into said span to a safe level, in response to determination of an open span based solely on real-time detection of a change in said out-of-band ASS power level.

2. The distributed Raman amplification system of claim 1, wherein said control unit includes:
   i. a detection and analysis function to detect and analyze in real-time said change in out-of-band ASS power level,
   ii. an open span determining function to determine whether said change in out-of-band ASS power level indicates an open span,
   iii. a safety function activated when said open span is determined, to effect said reduction of Raman pump energy entering the span.

3. The distributed Raman amplifier of claim 2, wherein said safety function is operative to activate a complete shutdown of said pump unit.

4. The distributed Raman amplification system of claim 2, wherein said control unit is operative such that the time elapsed between the occurrence of said open span and the activation of said safety function is shorter than an eye-safe time.

5. The distributed Raman amplification system of claim 2, wherein said control unit further includes an open span characteristics determining function, operative to determine the approximate position of the opening in said open span based on the magnitude of said change in said out-of-band ASS power level.

6. The distributed Raman amplification system of claim 5, wherein said control unit further includes a span degradation function operative to detect degradation in said span before said degradation develops into said open span.

* * * * *